United States Patent [19]

Sezi

[11] Patent Number: 5,742,156
[45] Date of Patent: Apr. 21, 1998

[54] DIGITAL PROCESS FOR OBTAINING A MEASURED PARAMETER FROM AN ELECTRIC SIGNAL

[75] Inventor: Tevfik Sezi, Berlin, Germany

[73] Assignee: Siemens Aktiengesellschaft, Germany

[21] Appl. No.: 604,935

[22] PCT Filed: Jul. 15, 1994

[86] PCT No.: PCT/DE94/00873

§ 371 Date: Apr. 24, 1996

§ 102(e) Date: Apr. 24, 1996

[87] PCT Pub. No.: WO95/06880

PCT Pub. Date: Mar. 9, 1995

[30] Foreign Application Priority Data

Aug. 31, 1993 [DE] Germany .......................... 43 30 179.7

[51] Int. Cl.⁶ .......................... G01R 19/25; G01R 23/00
[52] U.S. Cl. .......................... 324/76.24; 324/77.11
[58] Field of Search .......................... 324/76.12, 76.15, 324/76.24, 76.35, 76.38, 77.11; 327/91

[56] References Cited

U.S. PATENT DOCUMENTS

| 4,057,756 | 11/1977 | Ley et al. ........................ 324/76.24 |
| 4,093,988 | 6/1978 | Scott ............................... 324/76.24 |
| 4,563,637 | 1/1986 | DeBortoli et al. ............... 324/76.11 |
| 5,307,284 | 4/1994 | Brunfeldt et al. ............... 324/76.12 X |

FOREIGN PATENT DOCUMENTS

| 42 11 946.4 | 7/1991 | Germany . |
| 41 22 399 A1 | 1/1993 | Germany . |
| 42 05 300 | 7/1993 | Germany . |
| 93/20454 | 10/1993 | WIPO . |

OTHER PUBLICATIONS

Taha et al, "Direct Digital RMS Measuring Device", International Journal of Electronics, vol. 59, No. 2, Aug. 1985, pp. 199–210.

P. Profos and T. Pfeifer, "Handbuch der industriellen Messtechnik [Handbook of Industrial Measurement Technology]," 1992 pp. 403 to 405. (month unavailable).

R. Felderhoff, "Elektrishche und elektronishche Messtechnik [Electric and Electronic Measurement Technology]," 5th edition, 1990, pp. 307 to 312. (month unavailable).

R. Lappe and F. Fischer, "Leistungselektronik–Messtechnik [Power Electronic Measurement Technology]," 2nd edition, 1993, p. 242. (month unavailable).

J. Heydeman and E. N. Lulf, "Microprocessor Based Underfrequency Relaying," Delft University of Technology, the Netherlands, published in IEE Conference Publication No. 249, Third Internal Conference on Developments in Power System Protection, 1985, pp. 24 to 28. (month unavailable).

Primary Examiner—Glenn W. Brown
Attorney, Agent, or Firm—Kenyon & Kenyon

[57] ABSTRACT

A process for obtaining a measured value from an electric signal with a predetermined rated frequency, wherein the electric signal is scanned with a scanning frequency that is N times the rated frequency. After analog-to-digital conversion, the measured value is determined in an analyzer. In order to determine the measured value with a comparatively high accuracy, a measured value ($f_{Nist}$) is generated by means of a frequency meter (8). The measured value ($f_{Nist}$) is multiplied by a factor N yielding a derived measured value ($f_{Asoll}$). An analog-to-digital converter (1) is clocked with a scanning frequency ($f_A$) that corresponds to the derived measured value ($f_{Asoll}$).

4 Claims, 1 Drawing Sheet

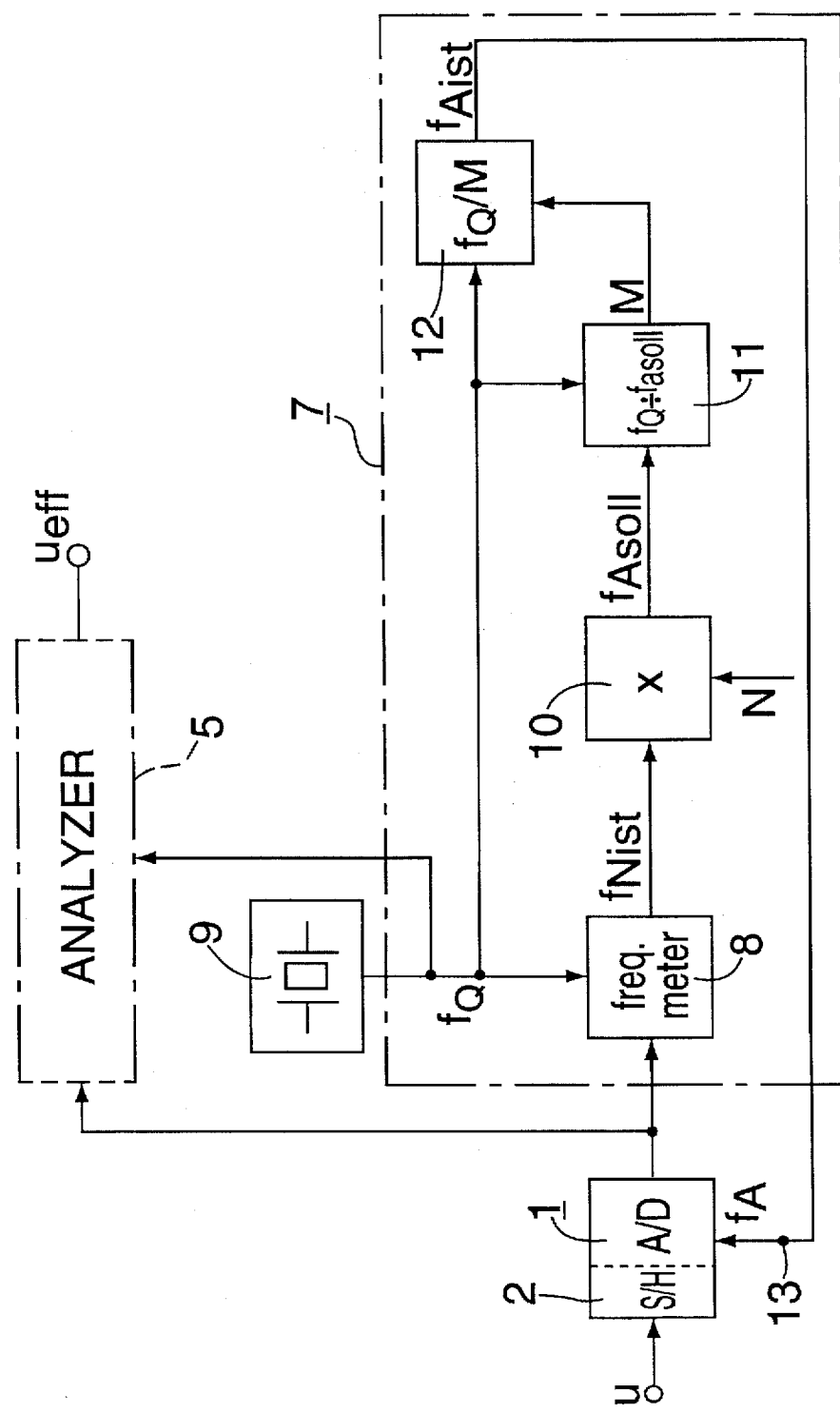

DIGITAL PROCESS FOR OBTAINING A MEASURED PARAMETER FROM AN ELECTRIC SIGNAL

FIELD OF THE INVENTION

The present invention relates to a digital process for obtaining a measured parameter from an electric signal having a predetermined rated frequency, and more particularly wherein:

the electric signal is scanned by a scanning device that yields scanning values with a scanning frequency that is generated by a clock generator and corresponds to N times the rated frequency of the electric signal, the scanned values are converted to digital values in an analog-digital converter and the measured value parameter is obtained from the digital values in an analyzer.

BACKGROUND INFORMATION

A digital process for obtaining a measured parameter from an electric signal is described, for example, in the book by P. Profos and T. Pfeifer, *Handbuch der industriellen Messtechnik* [*Handbook of Industrial Measurement Technology*], 1992, pages 404 and 405. In this known method, in order to measure the effective value, an electric signal formed from an electric voltage with a predetermined frequency is scanned and subjected to an analog-to-digital conversion and then used to calculate the effective voltage value in an analyzer. An effective current value and the electric power can be determined with this known method.

Other known processes of this type are described in the book by R. Felderhoff *Elektrische und elektronische Messtechnik* [*Electric and Electronic Measurement Technology*], 5th edition, 1990, pages 307 to 311 and the book by R. Lappe and F. Fischer *Leistungselektronik-Messtechnik* [*Power Electronic Measurement Technology*], 2nd edition, 1993, page 242.

The frequency measurement can be performed as described in the article by J. Heydeman and E. N. Lulf "Microprocessor Based Underfrequency Relaying," Delft University of Technology, the Netherlands, published in IEE Conference Publication No. 249, Third Internal Conference on Developments in Power System Protection, 1985, pages 24 to 28. The voltage is scanned with a frequency of 2.5 kHz, which is accomplished by programming the microprocessor to generate interrupts with this frequency. The passage of the voltage through zero is detected by the software. The frequency of the voltage can then be calculated from the number of pulses counted during one period of the voltage by forming the ratio of the scanning frequency to the number of pulses per period. The accuracy of this known method of frequency measurement is determined first by the accuracy that can be achieved in determining the length of the period and second by the scanning frequency.

SUMMARY OF THE INVENTION

An object of the present invention is to provide a digital method of determining a measured value from an electric signal, so the measured value can be determined with a much greater accuracy than has been possible with the known method described above, and this can be accomplished without any significant increase in effort or expense and without requiring a longer analysis time.

To achieve this object, the following measures are implemented according to the present invention in a digital process of the type described above:

a measured value that corresponds to the instantaneous frequency of the electric signal is determined with a frequency measurement device, the measured value is multiplied by a factor N, generating a derived measured value, an intermediate value that corresponds to the ratio of the clock frequency of the clock generator to the derived measured value is formed in a quotient forming circuit and this intermediate value is used to adjust the divider ratio of a frequency divider installed between the clock generator and the clock input of an analog-digital converter so that the frequency corresponding to the derived measured value is sent to the clock input, where a change in the divider ratio is not implemented until after several periods of the electric signal have elapsed.

It is known from German Patent 41 22 399 A1 that the scanning frequency in a process for digital measurement of voltages and currents in a power supply system can be derived from the instantaneous frequency of the variable parameter measured in order to be able to perform relatively accurate measurements. German Patent No. 41 22 399 A1, however, does not contain any reference to a clock generator or a downstream quotient forming circuit that receives a measured parameter derived from the instantaneous frequency of the electric signal measured.

An important advantage of the process according to the present invention is that regardless of the instantaneous frequency of the analog electric signal measured in each case, it uses a scanning frequency corresponding to N times the instantaneous frequency of the electric signal. This yields a great increase in measurement accuracy because the number of scans performed per period of the electric signal is always the same even at signal frequencies other than the rated frequency. In the process according to the present invention, the scanning frequency is adjusted to the respective measured frequency of the electric signal. This is accomplished with a great accuracy because an intermediate value that corresponds to the ratio of the clock frequency of the clock generator to the derived measured value is formed in the quotient forming circuit. This assures that the scanning frequency will always be derived anew from the clock frequency of the clock generator. This is done with a high accuracy because an intermediate value corresponding to the ratio of the clock frequency of the clock generator and the derived measured value is formed in the quotient forming circuit. This assures that the scanning frequency will always be derived anew from the clock frequency of the clock generator.

In the process according to the present invention, the frequency measurement device is preferably a digital frequency meter because of the high accuracy it permits in measuring the frequency.

The frequency measurement can be performed as described in the article by J. Heydeman and E. N. Lulf "Microprocessor Based Underfrequency Relaying", Delft University of Technology, the Netherlands, published in IEE Conference Publication No. 249, Third Internal Conference on Developments in Power System Protection, 1985, pages 24 to 28. The voltage is scanned with a frequency of 2.5 kHz, which is accomplished by programming the microprocessor to generate interrupts with this frequency. The passage of the voltage through zero is detected by the software. The frequency of the voltage can then be calculated from the number of pulses counted during one period of the voltage by forming the ratio of the scanning frequency to the number of pulses per period. The accuracy of this known method of frequency measurement is determined first by the accuracy that can be achieved in determining the length of the period and second by the scanning frequency.

The frequency of the electric signal can be determined with an especially high accuracy with a process whereby the digital frequency meter, as a linear-phase nonrecursive digital filter that receives the electric signal and has a symmetrical distribution of its filter coefficients, is designed as an all-pass filter; another linear-phase nonrecursive digital filter that also receives the electric signal and has a symmetrical distribution of its filter coefficients is designed as a low-pass filter such that its transmission function has a value of one at a predetermined frequency of the electric signal. Downstream from the all-pass filter there is a circuit element having a linear-phase transverse filter with a symmetrical distribution of its filter coefficients at the input in one branch, a downstream delay element and a downstream multiplier, and at the input, in a branch parallel to the first branch, there is another linear-phase transverse filter with an antisymmetrical distribution of its filter coefficients and with a transmission function value of one at a predetermined frequency, another downstream delay element and another downstream multiplier, where one multiplier is also connected at the input to an output of the second transverse filter, and the other multiplier is also connected to the output of the first transverse filter, and it contains a differentiating circuit whose inputs are connected to the outputs of the multiplier. A circuit device identical in design to the circuit element is connected downstream from the low-pass filter and the output of the differentiating circuit of the circuit element and the output of the circuit device are connected to a quotient forming circuit, which is upstream from a square root extractor that is in turn connected to an inverse function forming circuit. Additional details and advantages of this type of frequency measurement can be obtained from the German Patent Application P 42 11 946.4 or the corresponding International Patent Application PCT/DE/93/00262.

BRIEF DESCRIPTION OF THE DRAWINGS

FIG. 1 shows a block diagram of a system for carrying out the process of the present invention.

DETAILED DESCRIPTION

FIG. 1 shows a block diagram of a system for implementing the present invention. The diagram of FIG. 1 serves primarily to illustrate the process according to the present invention. In practice, the process according to the present invention would preferably be carried out using a microprocessor.

As FIG. 1 shows, an analog electric signal u, such as the voltage of an electric power supply system (not shown), is sent to an analog-digital converter 1 that has an integrated scanning device 2 at the input. An analyzer 5 is connected downstream from analog-digital converter 1 to determine the effective value $u_{eff}$ of voltage u. In addition, a scanning signal generator 7 connected to the output of the analog-digital converter 1 has a digital frequency meter 8 at its input. The scanned digital values of electric signal u are picked up by downstream digital frequency meter 8 which may be designed and may function as described in detail in the article mentioned above. However, an arrangement such as that disclosed in the German Patent Application P 42 11 946.4-35 or the corresponding International Patent Application PCT/DE/93/00262 is the preferred type of frequency meter. Digital frequency meter 8—as well as analyzer 5—has a clock generator 9 that delivers a clock frequency $f_Q$ to the digital frequency meter 8. A measured value $f_{Nist}$ that represents the instantaneous frequency of the signal u is then obtained at the output of digital frequency meter 8.

The measured value $f_{Nist}$ is sent to a multiplier 10 where it is multiplied by a factor N. The factor N represents the ratio of the scanning frequency $f_A$ to the rated frequency of the analog electric signal u. For example, with a voltage in an electric power supply system as the analog electric signal u, the rated frequency is 50 Hz. This corresponds to the rated frequency of the system. A scanning frequency $f_A$ of 1 kHz, for example, is selected, so the factor N has a value of 20.

A derived measured value $f_{Asoll}$ that is obtained at the output of multiplier 10 provides the theoretical scanning frequency. In the numerical example given above, this frequency is thus 1 kHz in the case when the voltage u has a frequency of exactly 50 Hz. However, if the instantaneous frequency at the output of the digital frequency measurement device is found to be 49.5 Hz, for example, so that the measured value $f_{Nist}$ is 49.5 Hz, then a theoretical scanning frequency of only 990 Hz is calculated, because the derived measured value $f_{Asoll}$ is equal to $N \times f_{Nist}$. The derived measured value $f_{Asoll}$ is sent to a downstream quotient forming circuit 11 that also receives the clock frequency $f_Q$ of clock generator 9. Then an intermediate value M that can be described by the following equation is obtained at the output of the quotient forming circuit:

$$f_Q/f_{Asoll}=M$$

The intermediate value M is used to alter the divider ratio of a downstream frequency divider 12 whose other input is connected directly to clock generator 9. Thus a signal with the frequency $f_{Aist}$ that can be described by the following equation is obtained at the output of frequency divider 12:

$$f_{Aist}=f_Q \cdot (f_{Asoll}/f_Q)$$

Therefore, the frequency $f_{Aist}$ corresponds to the theoretical scanning frequency, which assures that the analog-digital converter 1 will always be cycled with a frequency $f_A$ that corresponds exactly to N times the respective instantaneous frequency of the electric signal u. The output of frequency divider 12 is connected to a clock input 13 of analog-digital converter 1.

To keep the operation of the process described here stable, analog-digital converter 1 does not receive a newly adjusted scanning frequency immediately after there is a change in measured value $f_{Nist}$, but instead a delay is implemented in a manner that is not shown here but may be on the order of four periods of the electric signal u, for example. Only after four periods of the signal u have elapsed does any change in measured value $f_{Nist}$ have an effect on scanning frequency $f_A$.

What is claimed is:

1. A method for determining an effective value of an electric signal with a predetermined rated frequency, wherein:

the electric signal is scanned and digitized in an analog-to-digital converter with a scanning device having a scanning frequency corresponding to a factor N times the rated frequency of the electric signal, the analog-to-digital converter generating digital sample values from the electric signal, and an analyzer is used to determine the effective value from the digital sample values, the method comprising the steps of:

measuring the digital sample values generated by the analog-to-digital converter, with a frequency meter, to obtain a measured value corresponding to an instantaneous frequency of the electric signal;

multiplying the measured value by the factor N to yield a derived measured value;

generating an intermediate value M corresponding to a quotient of a clock frequency generated by a clock generator and the derived measured value;

generating the scanning frequency by dividing, in a frequency divider, the clock frequency by an adjustable divider ratio; and adjusting the divider ratio of the frequency divider using the intermediate value M so that the scanning frequency of the scanning device is equal to the derived measured value, wherein the step of adjusting the divider ratio is delayed for several periods of the electric signal.

2. The method of claim 1, wherein the frequency meter is a digital frequency meter.

3. A system for determining an effective value of an electric signal with a predetermined rated frequency, wherein:

the electric signal is scanned and digitized in an analog-to-digital converter with a scanning device having a scanning frequency corresponding to a factor N times the rated frequency of the electric signal, the analog-to-digital converter generating digital sample values from the electric signal, and an analyzer is used to determine the effective value from the digital sample values, the system comprising:

a frequency meter receiving the digital sample values for generating a measured value corresponding to an instantaneous frequency of the electric signal;

a multiplier for multiplying the measured value by the factor N to yield a derived measured value;

a quotient forming means for generating an intermediate value M corresponding to a quotient of a clock frequency generated by a clock generator and the derived measured value;

a frequency divider for generating the scanning frequency by dividing the clock frequency by an adjustable divider ratio, wherein the divider ratio is adjusted in accordance with the intermediate value M so that the scanning frequency of the scanning device is equal to the derived measured value; and delay means for delaying the adjustment of the divider ratio for several periods of the electric signal.

4. The system of claim 3, wherein the frequency meter is a digital frequency meter.

\* \* \* \* \*